United States Patent
Charvet

(10) Patent No.: US 7,709,757 B2
(45) Date of Patent: May 4, 2010

(54) MICROSYSTEM COMPRISING A DEFORMABLE BRIDGE

(75) Inventor: Pierre-Louis Charvet, Saint-Martin-le-Vinoux (FR)

(73) Assignee: Commissariat a l'Energie Atomique, Paris (FR)

(*) Notice: Subject to any disclaimer, the term of this patent is extended or adjusted under 35 U.S.C. 154(b) by 302 days.

(21) Appl. No.: 11/663,737

(22) PCT Filed: Oct. 11, 2005

(86) PCT No.: PCT/FR2005/002512

§ 371 (c)(1),
(2), (4) Date: Mar. 26, 2007

(87) PCT Pub. No.: WO2006/045914

PCT Pub. Date: May 4, 2006

(65) Prior Publication Data

US 2007/0279831 A1   Dec. 6, 2007

(30) Foreign Application Priority Data

Oct. 26, 2004   (FR) .................................. 04 11408

(51) Int. Cl.
*H01H 57/00* (2006.01)
(52) U.S. Cl. ...................... 200/181; 361/207
(58) Field of Classification Search .............. 200/181; 361/207
See application file for complete search history.

(56) References Cited

U.S. PATENT DOCUMENTS

| 5,867,202 | A | | 2/1999 | Knipe et al. |
|---|---|---|---|---|
| 6,046,659 | A | * | 4/2000 | Loo et al. ................... 333/262 |
| 6,115,231 | A | | 9/2000 | Shirakawa |
| 6,657,525 | B1 | * | 12/2003 | Dickens et al. ................ 335/78 |
| 6,828,888 | B2 | * | 12/2004 | Iwata et al. ................... 335/78 |
| 7,146,067 | B2 | * | 12/2006 | Despont et al. ............... 385/16 |
| 7,280,015 | B1 | * | 10/2007 | Schaffner et al. ............ 335/78 |
| 7,382,218 | B2 | * | 6/2008 | Charvet ...................... 335/78 |
| 2003/0132824 | A1 | | 7/2003 | Ma |

FOREIGN PATENT DOCUMENTS

EP    1 321 957 A1    6/2003

* cited by examiner

*Primary Examiner*—Renee Luebke
*Assistant Examiner*—Sean Kayes
(74) *Attorney, Agent, or Firm*—Oliff & Berridge, PLC

(57) ABSTRACT

The invention relates to a microsystem comprising a deformable bridge, the ends of which are connected to a substrate. According to the invention, at least one actuation electrode, which is solidly connected to the bridge, is disposed between the center of the bridge and one of the ends next to a counter electrode which is solidly connected to the substrate. The electrodes are intended to deform the deformable bridge such that a lower face of the bridge comes into contact with a contact element formed on the substrate.

11 Claims, 3 Drawing Sheets

MICROSYSTEM COMPRISING A DEFORMABLE BRIDGE

BACKGROUND OF THE INVENTION

The invention relates to a microsystem comprising a deformable bridge and actuating means designed to deform the deformable bridge in such a way that a bottom face of the bridge comes into contact with at least one contact element formed on a substrate, the bridge being attached via its ends to the substrate, the actuating means comprising at least one actuating electrode fixedly secured to the bridge and disposed between the centre of the bridge and one of the ends thereof, facing a counter-electrode fixedly secured to the substrate.

STATE OF THE ART

Microsystems comprising a micromechanical deformable bridge are used for example to produce radiofrequency switches or to achieve moveable mirrors, for example in active optics, in imaging or in optical telecommunication devices.

As represented in FIG. 1, a switch, for example, typically comprises a deformable bridge 1 attached via the ends 2 thereof to a substrate 3. The switch further comprises an actuator to deform the deformable bridge 1 in such a way that the bottom face of the bridge comes into contact with at least one contact element 4 formed on a substrate 3. The bottom face of the bridge 1 generally comprises a conducting element 5 that enables an electric contact to be established with the contact element 4. For example, two contact elements 4 can be formed by two sections of a radiofrequency line which are connected by the conducting element 5.

The actuator represented in FIG. 1 comprises two actuating electrodes 6 fixedly secured to the bridge 1 and disposed between the centre C of the bridge 1 and respectively one of the ends 2 thereof. Each of the actuating electrodes 6 is disposed facing a counter-electrode 7 fixedly secured to the substrate 3. When an electric actuating voltage is applied between the actuating electrodes 6 and the counter-electrodes 7, an attractive electrostatic force between each of the electrodes 6 and the corresponding electrode 7 causes deformation of the bridge 1 and thus enables the contact to be established between the bottom face of the bridge 1 and the contact element 4.

In FIG. 1, the actuating electrodes 6 are disposed on a top face of the bridge 1. In this way, the actuating electrodes 6 do not come into electric contact with the counter-electrodes 7 when the bridge is deformed. The actuating electrodes 6 can also be disposed on the bottom face of the bridge 1. In the latter case, to prevent the electrodes 6 from coming into electric contact with the counter-electrodes 7, an insulating layer is generally disposed on the counter-electrodes 7 or on the actuating electrodes 6.

The electric voltage required to actuate a micromechanical switch is at present typically about 40V. The electric voltage available in a portable device is however generally about 3V. It is therefore sought to design micromechanical switches operating at low electric voltage.

To reduce the electric voltage required for switching, it would in fact be possible to increase the length of the bridge and to reduce the thickness of the bridge. The thickness and length of the bridge can not however be chosen arbitrarily, since they determine the natural vibration frequencies of the bridge and thereby the characteristic switching time of the bridge, i.e. the speed at which the switch operates. A bridge having a large length and a small thickness does in fact present a long switching time and a too large flexibility which may impair the expected operation, for example by self-commutation linked to vibrations.

OBJECT OF THE INVENTION

The object of the invention is to remedy these shortcomings and to provide a microsystem operating at low voltage while presenting a short switching time.

According to the invention, this object is achieved by the appended claims and, more particularly, by the fact that the actuating electrode comprises a central zone disposed on the bridge, transversely to the bridge, and at least one projecting flexible lateral flange.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
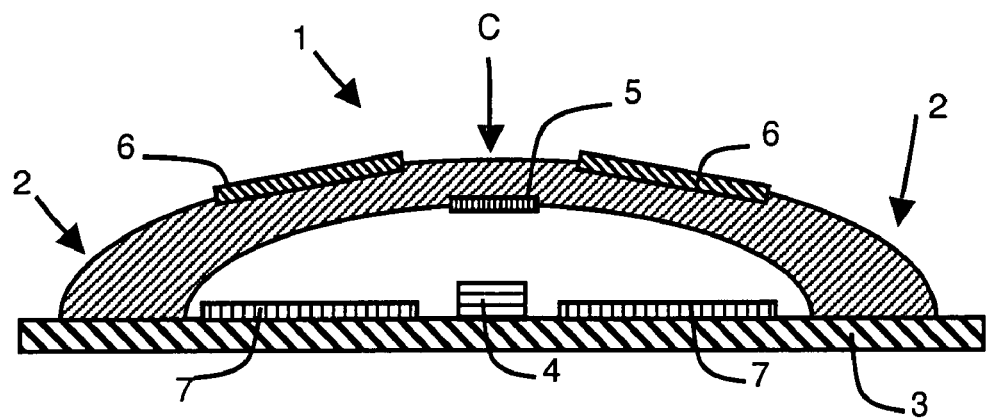
FIGS. 1 and 2 schematically illustrate a switch according to the prior art respectively in cross-section along the line A-A and in top view.
Figure 2:
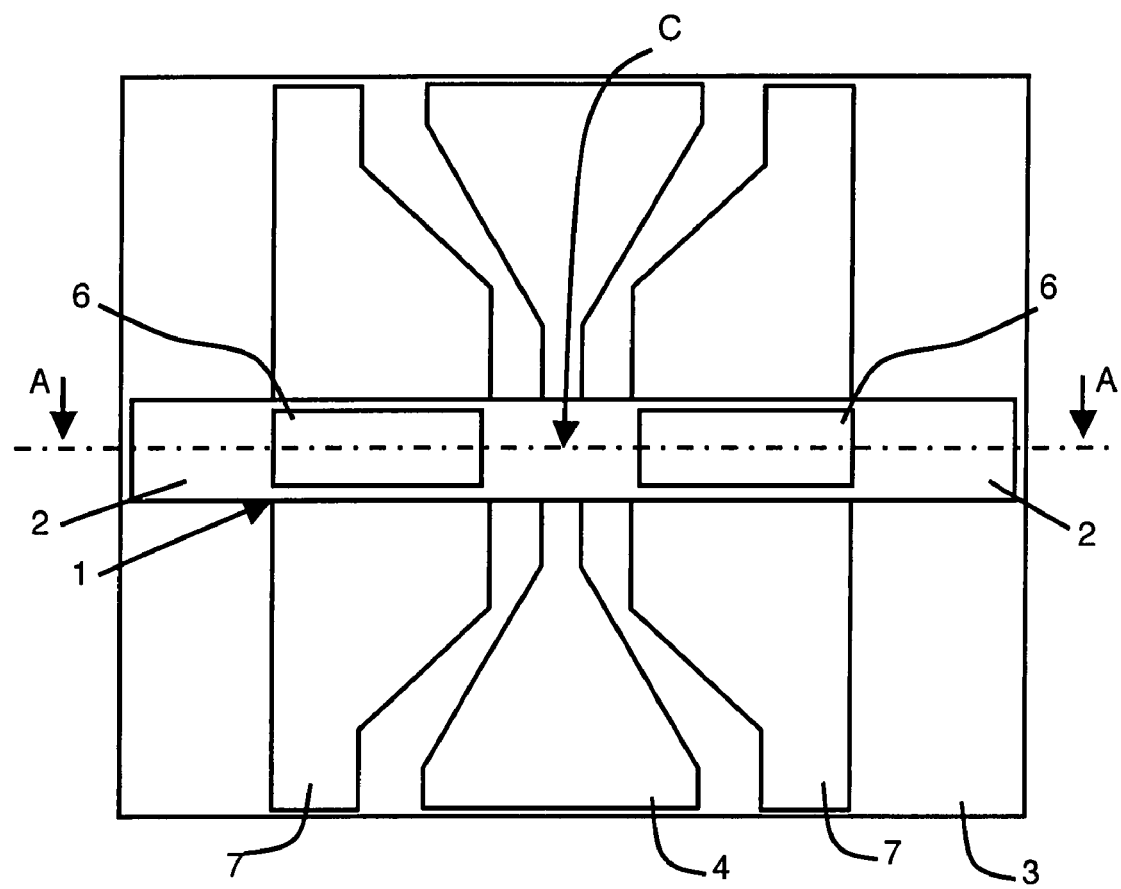
Figure 3:
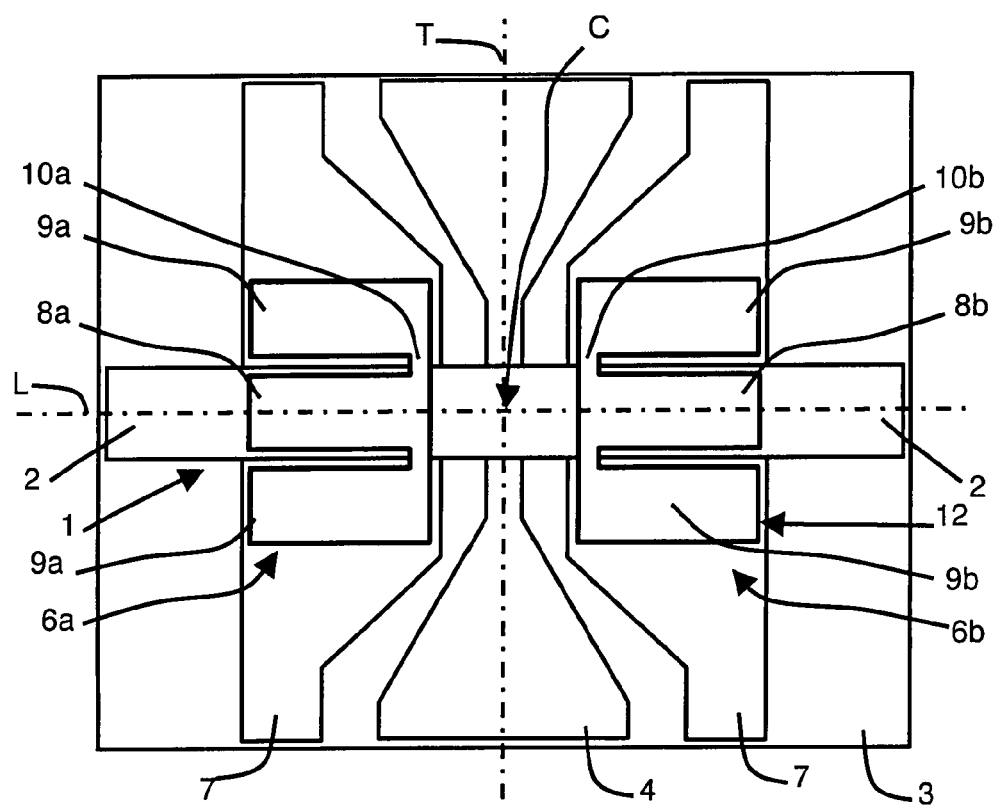
FIGS. 3 and 4 represent a top view of two particular embodiments of a switch according to the invention.

A longitudinal axis L of the bridge 1, passing through the two ends 2 of the bridge 1, and a transverse axis T arranged perpendicularly to the longitudinal axis L in a plane parallel to the substrate 3, are represented in FIG. 3. The intersection of the transverse axis T and of the longitudinal axis L corresponds to the centre C of the bridge 1. The switch represented in FIG. 3 comprises two actuating electrodes 6, in particular a first actuating electrode 6a arranged to the left of the centre C of the bridge in FIG. 3, and a second actuating electrode 6b arranged to the right of the centre C of the bridge in FIG. 3. The two actuating electrodes 6 are thus disposed, longitudinally, respectively on each side of the centre C of the bridge.

Each actuating electrode 6 comprises a central zone 8, transversely to the bridge 1, arranged on the bridge 1. Each central zone 8 can for example be disposed on the top face of the bridge 1 or on the bottom face of the bridge 1. The central zones 8 are fixedly secured to the bridge 1 and preferably disposed between two insulating layers so as to be buried in the bridge 1.

Moreover, in FIG. 3, each actuating electrode 6 comprises two projecting lateral flanges 9, transversely to the bridge 1, which flanges constitute a pair of lateral flanges. In FIG. 3, the two lateral flanges 9 of each actuating electrode 6 are disposed respectively on each side of the corresponding central zone 8 and therefore on each side of the longitudinal axis L. The actuating electrodes 6 are substantially flat and disposed in a plane parallel to the substrate 3. Each lateral flange 9 is connected to the corresponding central zone 8 by a narrower connecting zone 10 disposed on one side of the flange 9 that is closer to the centre C of the bridge 1. Thus, in FIG. 3, the connecting zone 10a connecting the lateral flange 9a to the central zone 8a of the left-hand electrode 6a is disposed on the right side of the flange 9a, and the connecting zone 10b connecting the flange 9b to the central zone 8b of the right-hand electrode 6b is disposed on the left side of the flange 9b.

The right-hand electrode 6b thus presents the shape of a capital E. Indeed, in FIG. 3, the central electrode 8b and the flanges 9b form three rectangles that are parallel with respect to their longitudinal axes and are connected by the connecting zones 10b which form the vertical bar of the capital E. The left-hand electrode 6a, in like manner, presents the shape of a back-to-front capital E.

Figure 4:
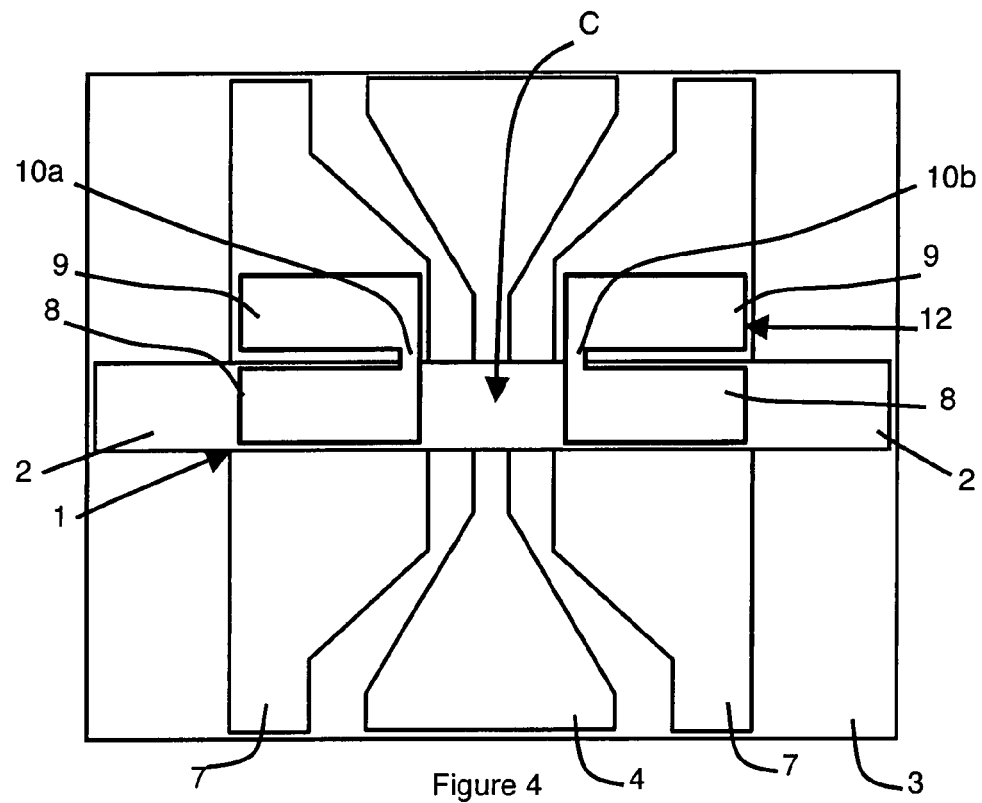

In the particular embodiment represented in FIG. 4, each actuating electrode 6 comprises a single lateral flange 9. The lateral flange 9a of the electrode 6a and the flange 9b of the electrode 6b are projecting on the same side of the longitudinal axis L.

Figure 5:
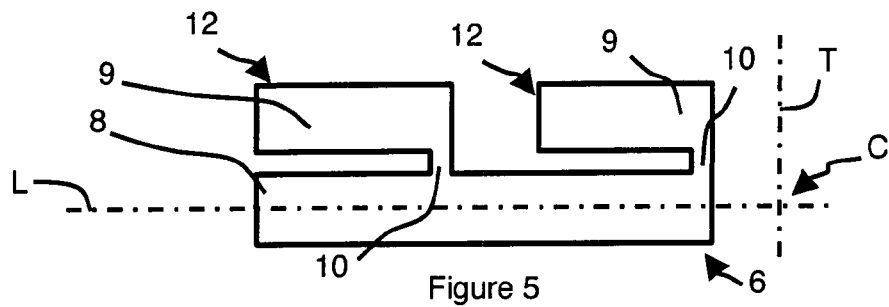
FIGS. 5 to 8 illustrate four particular embodiments of an actuating electrode of a switch according to the invention.

The actuating electrode 6 represented in FIG. 5 comprises two lateral flanges 9 projecting on the same side of the central zone 8. The actuating electrode 6 represented in FIG. 6 comprises four lateral flanges 9 projecting, two by two, respectively on each side of the central zone 8.

Figure 6:
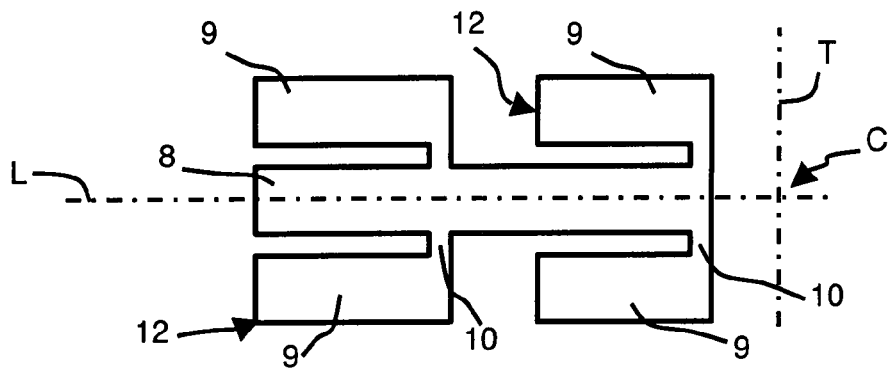

The actuating electrodes 6 represented in FIGS. 5 and 6 are designed to be situated to the left of the centre C of the bridge 1 so that the connecting zones 10 are disposed on the side of the corresponding flange that is closer to the centre C of the bridge, notably on the right side of each flange 9, as represented in FIGS. 5 and 6.

The lateral flanges 9 of the actuating electrodes 6 represented in FIGS. 3 to 6 thus each comprise a free end 12 arranged on the side of the corresponding flange that is farther away from the centre C of the bridge. When an electric actuating voltage is applied between the actuating electrodes 6 and the counter-electrodes 7, the free ends 12 of the lateral flanges 9 bend in the direction of the substrate 3 and the electrostatic attractive force at the free ends 12 therefore increases. The free ends 12 therefore bend even more and pull the bridge 1 down in the direction of the substrate 3, the corresponding force between the flanges 9 and the bridge 1 being transmitted by means of the connecting zones 10. As the connecting zones 10 are arranged on the side of the flange 9 that is closer to the centre C of the bridge, the mechanical torque applied to the bridge 1 by the bending flanges 9 is maximal. Adding the lateral flanges 9 according to the invention therefore enables a switch to be obtained that has an electric actuating voltage of about 15V instead of 40V for a comparable switch without flanges.

A flange 9 comprising a free end 12 automatically presents a lower stiffness than a flange having two fixed ends. Moreover, the choice of the material of the flanges 9 and of the thickness of the flanges 9 enables the stiffness of the flanges to be adjusted. The lateral flanges 9 are preferably buried between two insulating layers. The thickness of these insulating layers also contributes to the stiffness of the lateral flanges 9. Preferably, the assembly formed by the lateral flanges 9, the central zones 8 and the associated insulating layers is formed by a single stack of layers comprising at least one conducting layer and the insulating layers.

Figure 7:
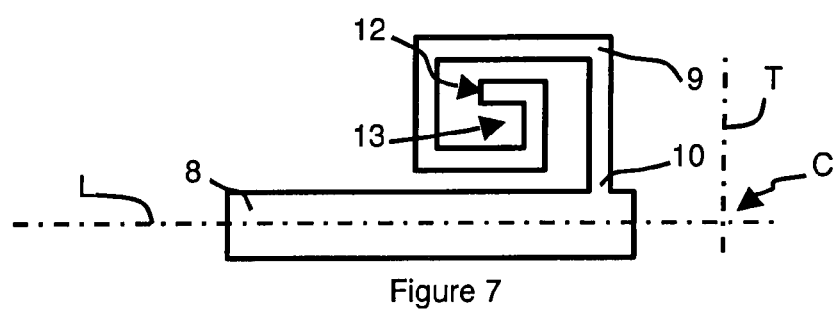

The flanges 9 can be of any geometric shape. In particular, as represented in FIG. 7, a flange 9 can form a coil having a free end 12 disposed near to the centre 13 of the flange 9. As previously, the flange 9 is connected to the corresponding central zone 8 by a narrower connecting zone 10 arranged on the side of the flange 9 that is closer to the centre C of the bridge 1, in particular on the right side of the flange 9, in FIG. 7. In this case, the flange 9 has a maximum developed length for a greatly reduced overall size. It can also be envisaged to associate with one electrode several flanges 9 in the form of a coil.

Figure 8:
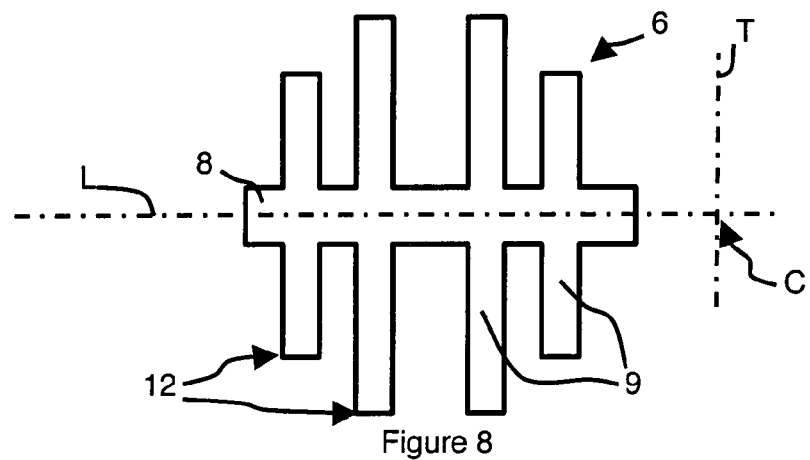

In all cases, the lateral flanges 9 must present a certain flexibility allowing their free ends 12 to bend. In the embodiments described above, the flexibility is provided essentially by the narrower connecting zone 10. In another alternative embodiment of the invention, represented in FIG. 8, the actuating electrode 6 comprises several narrow rectangular lateral flanges 9 each having a much greater length than width. The flexibility of each flange 9 is then due to the fact that the lateral flange 9 is long and narrow. In FIG. 8, the electrode 6 comprises four long central flanges 9 and four short peripheral flanges 9 forming a comb on each side of the electrode 6.

The flexibility of the flanges 9 can be characterized quantitatively by means of the stiffness constant k of a flange having a fixed end and a free end:

$$k = \frac{1}{4} \cdot \frac{E \cdot b \cdot h^3}{l^3}, \qquad \text{(eq. 1)}$$

where E is the Young's modulus of the material of the flange, b is the width of the flange in the plane of the flange parallel to the substrate, h is the thickness of the flange perpendicularly to the substrate, and l is the effective length, i.e. the developed length of the flange.

The stiffness constant K of the bridge 1 embedded at both ends can be determined according to the equation:

$$K = 16 \cdot \frac{E_p \cdot b_p \cdot h_p^3}{l_p^3}, \qquad \text{(eq. 2)}$$

where $E_p$ is the Young's modulus of the material of the bridge, $b_p$ is the width of the bridge in the plane of the bridge parallel to the substrate, $h_p$ is the thickness of the bridge perpendicularly to the substrate, and $l_p$ is the length of the bridge.

Whereas the stiffness constant of the bridge embedded at both ends comprises a factor 16 in equation 2, equation 1 for a flange having a free end takes a factor ¼, i.e. 64 times less. When the other parameters are identical, a flange having a free end therefore presents a much lower stiffness than a beam having both its ends embedded. This is advantageous in particular when the flanges 9 and the bridge 1 are produced by the same steps and therefore present the same thickness.

The flanges 9 preferably have a thickness h of about one micrometer and a width b comprised between 30 and 50 micrometers. The effective length l, i.e. the developed length of the flange 9, is for example comprised between 100 and 200 micrometers for a switch having an electric actuating voltage of 15V. The longer the effective length of the flange, the further the electric actuating voltage of the switch can be reduced. When the effective length is around 500 micrometers, an electric actuating voltage of 3V can be envisaged.

The flanges 9 and possibly the bridge 1 are preferably made from silicon oxide $SiO_2$ or silicon nitride SiN. Other materials can be chosen, for example metals. In the latter case, electrical insulators have to be provided to insulate the metal flanges from the elements having electrical functions such as the different electrodes.

The invention is not limited to the embodiments represented. In particular, there can be any number of actuating electrodes 6. For example, a single actuating electrode 6 may be sufficient, but it can also be envisaged to provide several actuating electrodes 6 on each side of the centre C of the bridge. Furthermore, any combination of the different actuating electrodes 6 represented can be envisaged. The invention further applies to any type of microsystems comprising a deformable bridge, for example switches, moveable mirrors, and so on.

The invention claimed is:

1. A microsystem comprising:
   a deformable bridge having two ends and a longitudinal axis passing through its two ends; and
   actuating means designed to deform the deformable bridge in such a way that a bottom face of the bridge comes into contact with at least one contact element formed on a substrate, the bridge being attached only via its two ends to the substrate,
   wherein the actuating means includes at least one actuating electrode fixedly secured to the bridge and disposed between the center of the bridge and one of the ends thereof, facing a direction towards a counter-electrode fixedly secured to the substrate, and
   wherein the actuating electrode includes a central zone disposed on the bridge and at least one flexible lateral flange, connected to the central zone, and projecting laterally from the bridge,
   wherein the at least one flexible lateral flange is more flexible than the bridge.

2. The microsystem according to claim 1, wherein the at least one flexible lateral flange is attached to the central zone of the actuating electrode by a connecting zone that is narrower than the lateral flange and is disposed on the side of the flange that is closer to the center of the bridge.

3. The microsystem according to claim 2, wherein the at least one flexible lateral flange forms a coil.

4. The microsystem according to claim 1, wherein the at least one flexible lateral flange has a narrow rectangular shape.

5. The microsystem according to claim 1, includes at least two actuating electrodes respectively disposed on each side of the center of the bridge.

6. The microsystem according to claim 1, wherein each actuating electrode includes at least one pair of lateral flanges respectively disposed on each side of the corresponding central zone.

7. The microsystem according to claim 1, wherein each actuating electrode includes at least two lateral flanges projecting on the same side of the central zone of the actuating electrode.

8. The microsystem according to claim 1, wherein the at least one lateral flange is only attached to the central zone of the actuating electrode by a connecting zone that is narrower than the lateral flange and is disposed on the side of the flange that is closer to the center of the bridge.

9. The microsystem according to claim 1, wherein the flexible lateral flange has two ends and one of the ends is connected to the central zone and the other end is free.

10. The microsystem according to claim 1, wherein a stiffness constant k of the flexible lateral flange is represented by the following equation:

$$k = \frac{1}{4} \cdot \frac{E \cdot b \cdot h^3}{l^3},$$

wherein E is a Young's modulus of a material of the flexible lateral flange, b is a width of the flexible lateral flange in a plane of the flexible lateral flange parallel to the substrate, h is a thickness of the flexible lateral flange perpendicular to the substrate, and l is an effective length of the lateral flange.

11. The microsystem according to claim 1, wherein a stiffness constant K of the bridge can be represented by equation:

$$K = 16 \cdot \frac{E_p \cdot b_p \cdot h_p^3}{l_p^3},$$

wherein $E_p$ is the Young's modulus of a material of the bridge, $b_p$ is a width of the bridge in the plane of the bridge parallel to the substrate, $h_p$ is a thickness of the bridge perpendicularly to the substrate, and $l_p$ is a length of the bridge.

* * * * *